(12) United States Patent
Brown

(10) Patent No.: US 6,214,413 B1
(45) Date of Patent: Apr. 10, 2001

(54) METHOD AND APPARATUS FOR FABRICATING A WAFER SPACING MASK ON A SUBSTRATE SUPPORT CHUCK

(75) Inventor: Karl Brown, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/231,323

(22) Filed: Jan. 13, 1999

(51) Int. Cl.[7] ................................ B05D 1/32; B05D 5/00
(52) U.S. Cl. ................ 427/282; 118/504; 118/720; 118/721; 204/192.12; 204/298.11
(58) Field of Search ............. 204/192.12, 298.11; 118/504, 720, 721; 427/282

(56) References Cited

U.S. PATENT DOCUMENTS

| | | | |
|---|---|---|---|
| 5,117,121 | 5/1992 | Watanabe et al. | 307/130 |
| 5,415,753 * | 5/1995 | Hurwitt et al. | 204/192.12 |
| 5,656,093 | 8/1997 | Burkhart et al. | 118/728 |
| 5,863,396 * | 1/1999 | Flanigan | 204/298.11 |
| 6,030,513 * | 2/2000 | Ghantiwala et al. | 204/298.11 |

\* cited by examiner

*Primary Examiner*—Nam Nguyen
*Assistant Examiner*—Steven H. Ver Steeg
(74) *Attorney, Agent, or Firm*—Thomason, Moser & Patterson, LLP

(57) ABSTRACT

A method and apparatus for fabricating a wafer spacing mask on a substrate support chuck. Such apparatus is a stencil containing a plurality of apertures and at least one high aspect ratio opening that is positioned atop the substrate support chuck while material is deposited onto the stencil and through the apertures and high aspect ratio openings onto the chuck. Upon completion of the deposition process, the stencil is removed from the workpiece support chuck leaving deposits of the material of various widths but the same heights to form the wafer spacing mask.

15 Claims, 7 Drawing Sheets

US 6,214,413 B1

METHOD AND APPARATUS FOR FABRICATING A WAFER SPACING MASK ON A SUBSTRATE SUPPORT CHUCK

BACKGROUND OF THE DISCLOSURE

1. Field of the Invention

The invention relates to a sputter mask or stencil used to control deposition of material in a physical vapor deposition (PVD) system. More particularly, the invention relates to a method and apparatus for precise formation of features on the surface of a substrate support chuck used in a process chamber to fabricate a wafer spacing mask upon said substrate support chuck.

2. Description of the Background Art

Substrate support chucks are widely used to support substrates within semiconductor processing systems. More specifically, a semiconductor processing system may have one or more chambers through which the substrates are passed to create a desired product (i.e., a silicon based wafer having IC devices formed thereupon). A chuck is disposed within the chamber to support the substrate and retain it in a stationary position during processing (i.e., etching, deposition and the like). A particular type of chuck is a ceramic electrostatic chuck that is used in high-temperature physical vapor deposition (PVD). Such electrostatic chucks contain one or more electrodes imbedded within a ceramic chuck body. The ceramic material is typically aluminum-nitride or alumina doped with a metal oxide such as titanium oxide ($TiO_2$) or some other ceramic material with similar resistive properties. This form of ceramic is partially conductive at high temperatures.

In the traditional use of ceramic electrostatic chucks, a wafer rests flush against the surface of the chuck body as a chucking voltage is applied to the electrodes. Because of the conductive nature of the ceramic material at high temperatures, the wafer is primarily retained against the ceramic support surface by the Johnsen-Rahbek effect. Such a chuck is disclosed in U.S. Pat. No. 5,117,121 issued May 26, 1992 and incorporated herein by reference.

One disadvantage of using a chuck body fabricated from ceramic is that, during manufacture, the support surface is "lapped" to smooth the ceramic material. Such lapping produces particles that adhere to the support surface. These particles are very difficult to completely remove from the support surface. The lapping process may also fracture the chuck body. Consequently, as the chuck is used, particles are continuously produced by these fractures. Additionally, during wafer processing, the ceramic material can abrade a wafer oxide coating from the underside of the wafer resulting in further introduction of particulate contaminants to the process environment. During use of the chuck, the particles can adhere themselves to the underside of the wafer and be carried to other process chambers or cause defects in the circuitry fabricated upon the wafer. It has been found that tens of thousands of contaminant particles can adhere to the backside of a given wafer after retention upon a ceramic electrostatic chuck.

To overcome the disadvantages associated with the wafer contacting the substrate support chuck, a wafer spacing mask is deposited upon the surface of the substrate support chuck. Such a wafer spacing mask is disclosed in commonly assigned U.S. Pat. No. 5,656,093 issued Aug. 12, 1997. The material deposited upon the support surface of the chuck body, to form the wafer spacing mask, is a metal or other materials, including conductors, insulators and semiconductors. Usually the material is deposited to form a plurality of pads that support the wafer above the surface of the substrate support. Thus, the wafer spacing mask reduces the amount of contaminant particles that adhere to the underside of the wafer.

A device suitable for forming the spacing mask is disclosed in commonly assigned U.S. patent application Ser. No. 08/736,887 filed Oct. 25, 1996 now U.S. Pat. No. 5,863,396 issued Jan. 26, 1999 and is herein incorporated by reference. FIG. 1 depicts the above-referenced device as a plate-shaped stencil 100 having a plurality of apertures 108 and a plurality of slots 106 although various other configurations are possible. Material is deposited through the apertures 108 and slots 106 (e.g., via physical vapor deposition) to create the desired surface features on the support surface.

It is sometimes necessary to create features on the support surface having different dimensions. For example, some of the deposited pads need to be of a large diameter, or peripheral electrical traces (formed by the slots 106) on the surface need to be longer or wider than a pad (formed by the apertures 108). FIG. 2 depicts a cross-section of the stencil 100 (shown along lines 2—2 of FIG. 1) placed on top of a surface 210 of a ceramic electrostatic chuck 200 following deposition of the surface features by physical vapor deposition. As can be seen, some deposited material 206 forms on the stencil thereby creating no features on the support surface. Some deposited material forms support surface features 204 that have larger dimensions than other features 202. The larger features will generally be thicker in profile as a result of the "shadowing" effect. The "shadowing" effect is a condition by which PVD material approaching the stencil at angles that are not nearly perpendicular to the stencil is deposited on the sidewalls of the aperture instead of the support surface. That is, for smaller features (having narrower stencil openings) less material is deposited on the support surface as compared to a sidewall of the stencil. Conversely, larger features (having wider openings) will be less prone to the "shadowing" effect as more material will deposit on the support surface than on the sidewalls. However, this will cause the larger features to protrude above a desired height "d" on the surface 210. Unfortunately, this condition is undesirable as it leads to non-uniform substrate support, i.e., the point of contact of the various features with the wafer will be at different heights. Non-uniform substrate support alters the critical temperature profile on the wafer and results in excessive bowing of the wafer during chucking. These undesirable conditions eventually alter the quality of the final product.

One possible solution to forming features having uniform profiles (heights) is to create a separate stencil for each feature to be formed. That is, Stencil A consists just of apertures for forming pads, Stencil B consists just of slots for forming peripheral electrical traces and so on. Each stencil then in turn is placed over the support surface and a separate deposition process is executed to form the features specific to the stencil. However, such a method and apparatus is time consuming and requires various stencils which increases overall cost of fabricating the desired support surface features.

Therefore, a need exists in the art for a method and apparatus for fabricating a wafer spacing mask having multiple features wherein the multiple features are formed simultaneously and uniformly in profile.

SUMMARY OF THE INVENTION

The disadvantages heretofore associated with the prior art are overcome by a method and apparatus for forming features on a surface of a substrate support chuck. The apparatus is a stencil containing a plurality of apertures and at least one high aspect ratio opening. The stencil further comprises a two-piece structure wherein a first, plate shaped piece has a central opening and a second piece containing the at least one high aspect ratio opening is disposed in the central opening of the first piece. The plurality of apertures further comprises sidewalls and the at least one high aspect ratio opening further comprises sidewalls wherein the high aspect ratio sidewalls are taller than the aperture sidewalls. Preferably, the stencil has a first high aspect ratio opening as an arc segment located at a center of the stencil with a ratio of approximately 0.8:1 and a second high aspect ratio opening that is ring-shaped and located radially outward of the first high aspect ratio opening with a ratio of approximately 2.4:1. The stencil is preferably fabricated of a ceramic material such as alumina.

The apparatus may further comprise a plurality of slots located at a periphery of said stencil wherein the slots extend radially inward from the periphery of said stencil. A number of the plurality of slots extend radially inward further than others of the plurality of slots.

A method of forming features on a surface of a substrate support chuck with a stencil having at least one high aspect ratio comprises the steps of positioning the stencil on the surface of the substrate support chuck; depositing a material onto the stencil and through a plurality of apertures provided in the stencil and said at least one high aspect ratio opening to form said features upon the surface of the substrate support chuck; and removing said stencil and leaving said features upon said surface of said substrate support chuck. The method uses a stencil further comprising a first piece having a central opening and a second piece having said at least one high aspect ratio opening disposed in said central opening.

BRIEF DESCRIPTION OF THE DRAWINGS

The teachings of the present invention can be readily understood by considering the following detailed description in conjunction with accompanying drawings, in which.

To facilitate understanding, identical reference numerals have been used, where possible, to designate identical elements that are common to the figures.

DETAILED DESCRIPTION

Figure 1:
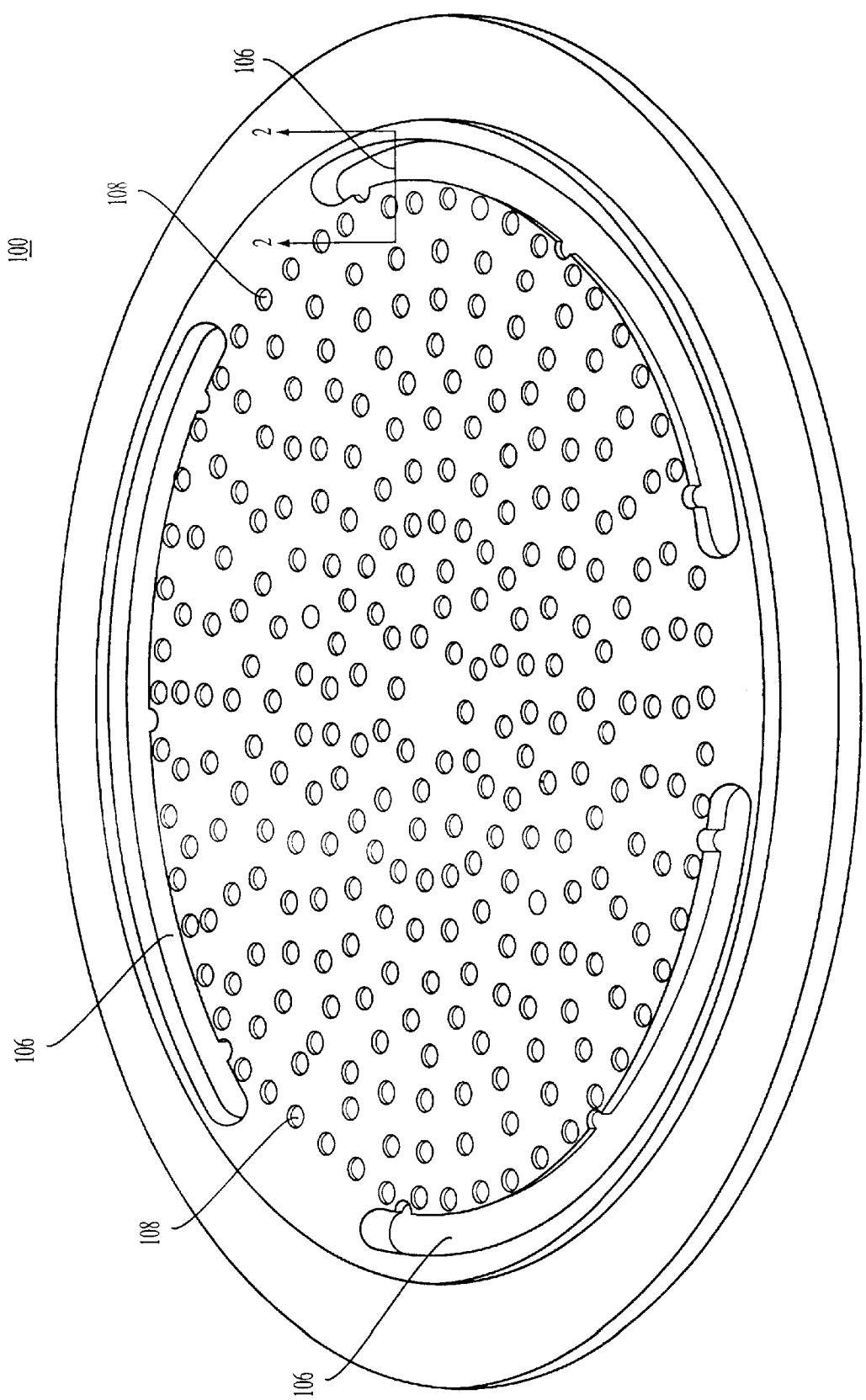
FIG. 1 depicts a perspective view of a prior art stencil for depositing support surface features.
Figure 2:
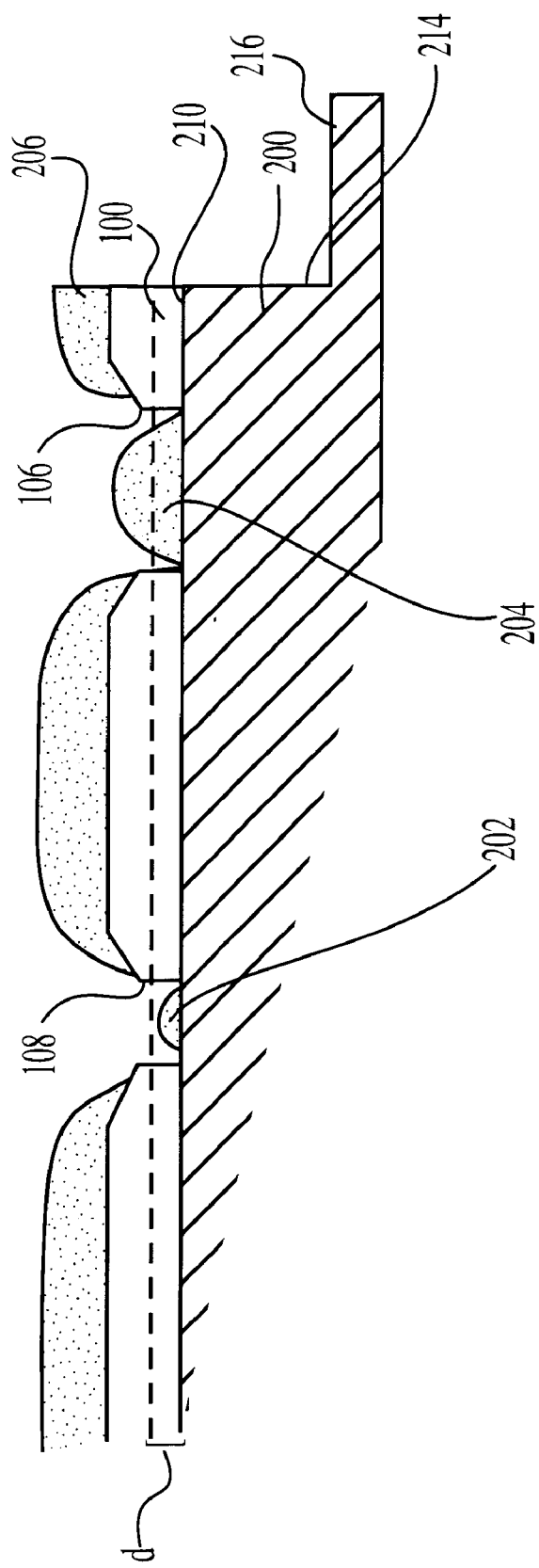
FIG. 2 depicts a cross-sectional view as seen along lines 2—2 of FIG. 1 of the prior art stencil.
Figure 3:
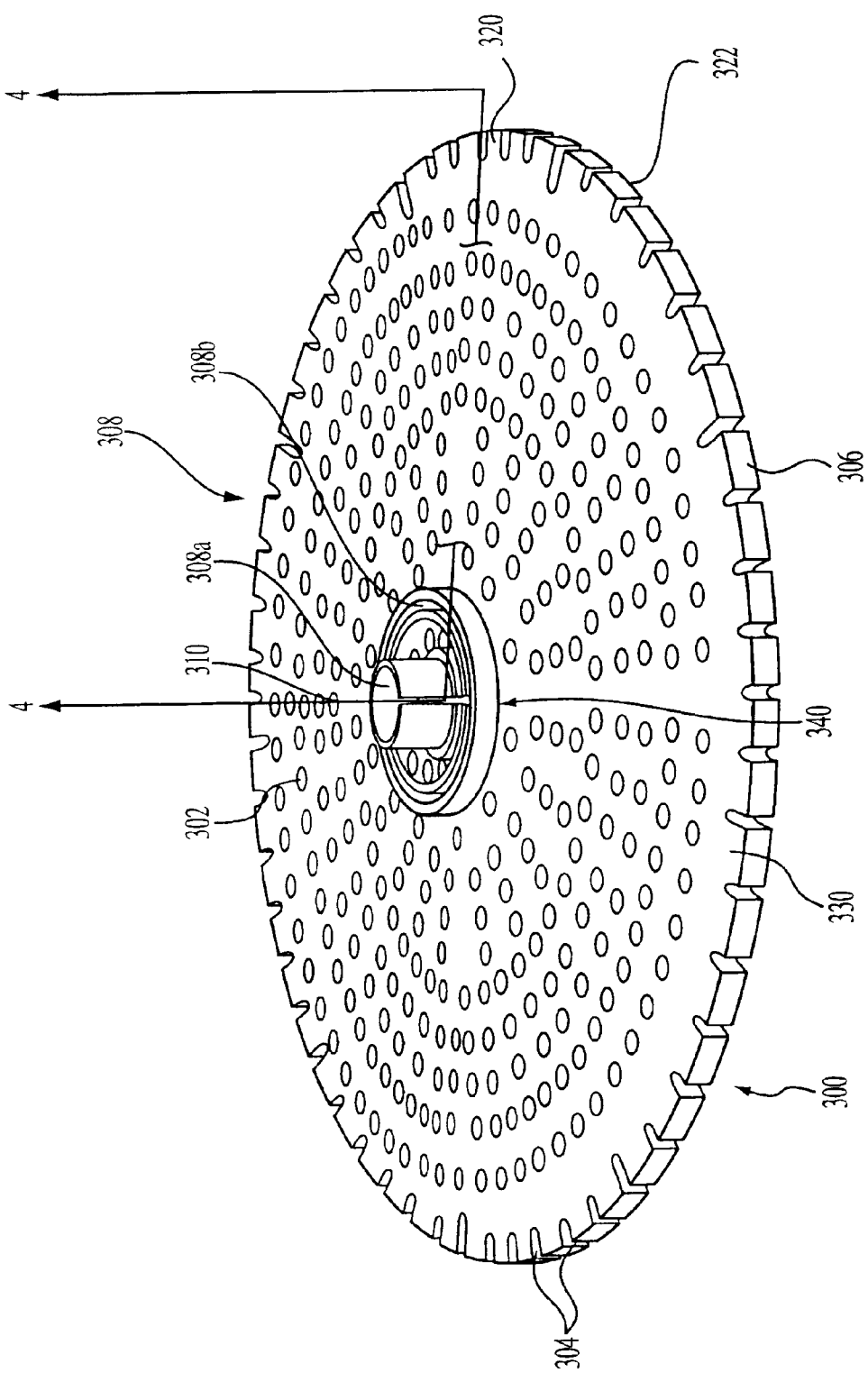
FIG. 3 depicts a front perspective view of a stencil in accordance with the present invention.
Figure 4:
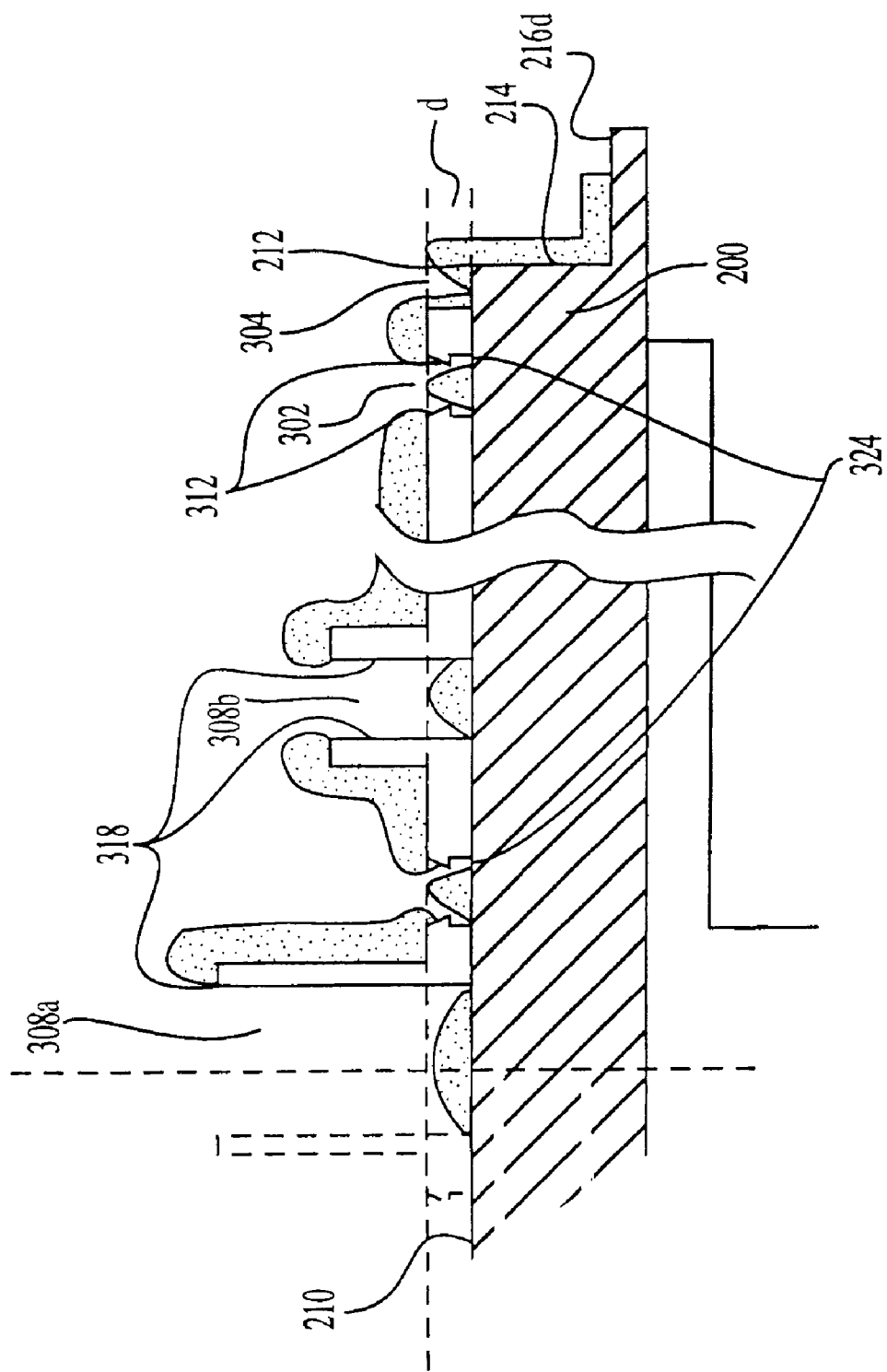
FIG. 4 depicts a cross-sectional view as seen along lines 4—4 of FIG. 3 of the stencil of the present invention positioned on a surface of a substrate support chuck.

FIG. 3 depicts a front perspective view of a sputter mask or stencil 300. To illustrate the use of the invention, FIG. 4 depicts a vertical cross-sectional view of the apparatus of FIG. 3, positioned on a surface 210 of a substrate support chuck 200. The cross-sectional view in FIG. 4 is simplified and not completely drawn to scale so that the features are shown in detail. For best understanding of the invention, the reader should simultaneously refer to both FIGS. 3 and 4 while reading the following disclosure.

Specifically, the stencil 300 is a two piece structure. A first piece 330 is a plate-shaped structure. The first piece 330 has an upper surface 320 and an underside surface 322. The first piece further contains a plurality of peripheral slots 304, and a plurality of apertures 302. Each of the plurality of slots 304 extends radially inward from a periphery 306 of the stencil 300. A number of the plurality of slots 304 may extend radially inward further than others of the plurality of slots. In a preferred embodiment of the invention, the plurality of slots is 54 and the number of slots extending further inward is 9. The slots 304 allow for features to be deposited at an edge 212, down along a sidewall 214 and flange 216 of the chuck 200. The plurality of apertures 302 further comprise sidewalls 312 of a specific height "d" that allow for features of similar size (i.e., a plurality of wafer spacing mask pads) to be deposited upon the surface 210 of the chuck 200. The height of the deposited pads is approximately equal to the sidewall height "d".

Figure 7:
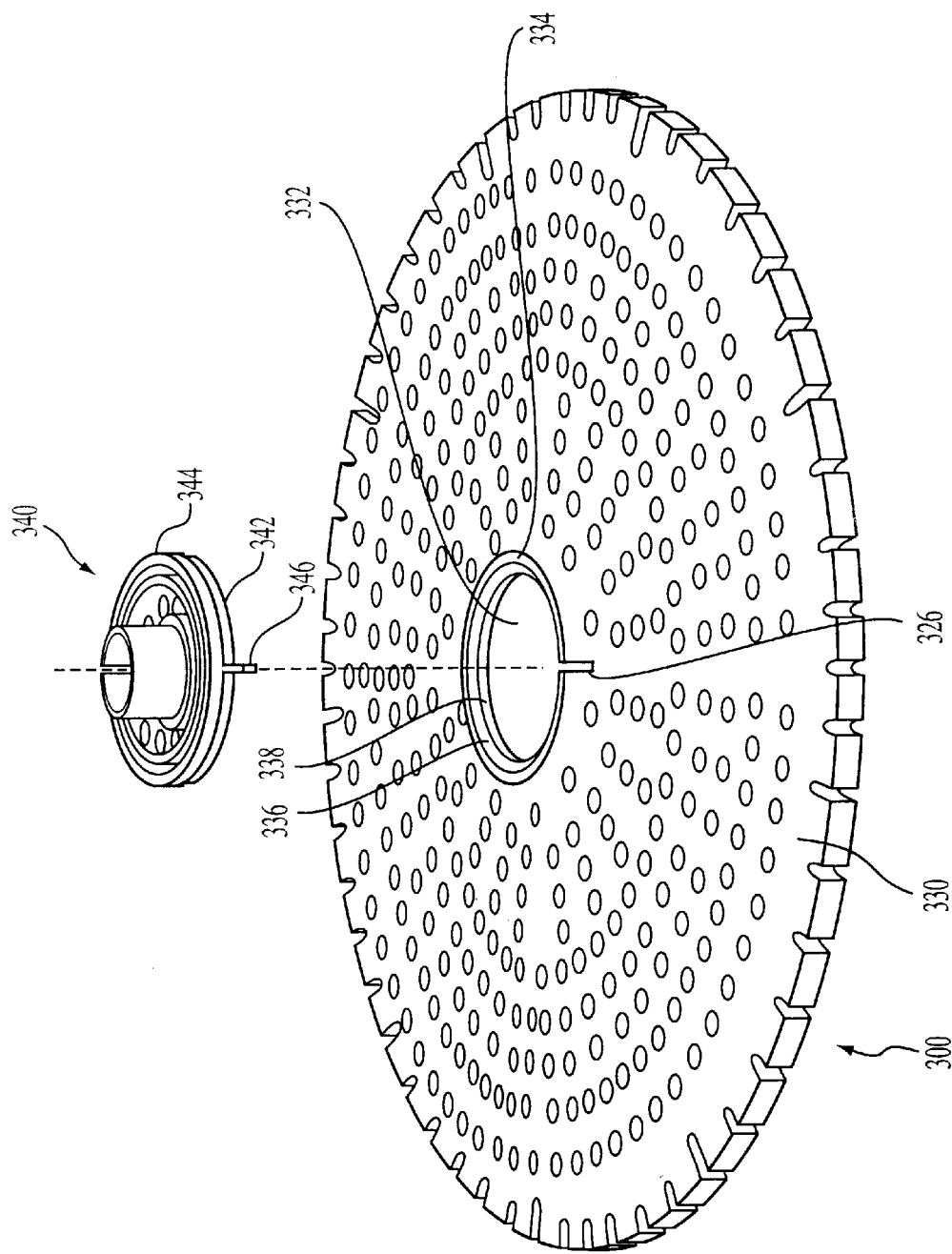
FIG. 7 is an exploded rear perspective view of the stencil (rotated 180° with respect to the view of FIG. 3) in accordance with the present invention.

FIG. 7 depicts an exploded view of the rear of the subject apparatus revealing further details. That is, FIG. 7 shows the apparatus from a point of view rotated 180° from the front perspective view of FIG. 3. Specifically, the first piece 330 is provided with a central opening 332. The first piece 330 has a circumferential lip 334 at the central opening 332. The circumferential lip 334 may have a stepped profile, beveling or other similar shape whereby an outer diameter 336 is larger than an inner diameter 338. A second piece 340 of the stencil 300 is disposed in the central opening 332. Specifically, the second piece 340 has a circumferential face 344 that is formed so as to meet and conform to the outer diameter 336 of the circumferential lip 334. Additionally, the second piece 340 has a second circumferential face 342 that is formed so as to meet and conform to the inner diameter 338. As such, the second piece 340 is supported by the circumferential lip 334 of the first piece 330. Additionally, an indexing tab 346 is provided on the second piece 340 that communicates with an indexing slot 326 on the first piece 330. The indexing tab 346 and indexing slot 326 ensure that the second piece 340 is properly oriented with respect to the first piece 330.

The second piece 340 is further provided with at least one high aspect ratio opening 308 (see FIGS. 3 and 4). The high aspect ratio opening 308 is utilized to form features that are larger (i.e., wider) than other features, for example electrodes, without altering the height of these wider features. In a preferred embodiment of the invention, two (2) high aspect ratio openings 308 are part of the stencil 300 and specifically incorporated into the second piece 340. A first high aspect ratio opening 308a is an arc segment located at a center 310 of the second piece 340. A second high aspect ratio opening 308b is ring-shaped and located radially outward of the first high aspect ratio opening 308a. The first high aspect ratio opening 308a forms for example an electrical trace such as a first inner electrode for chucking, wafer detection or the like. The second high aspect ratio opening 308b forms, for example, another electrical trace such as a second outer electrode used for similar purposes as the inner electrode. In a preferred embodiment of the invention, the first high aspect ratio opening has a ratio of approximately 0.8:1 and the second high aspect ratio opening has a ratio of approximately 2.4:1 (height:width).

Since features such as electrodes generally need to be more robust in size than wafer spacing mask pads, the opening to form such features that is incorporated into the stencil needs to be wider. However, in the prior art, and as stated earlier, the "shadowing" effect limits the number of possible angles that deposition material can have in order to reach the support surface. Hence narrow openings yield thinner features or a low deposition rate and wider openings yield thicker features with a much higher deposition rate. To solve this problem, the wider openings includes higher sidewalls 318 than the sidewalls 312 of the pad-forming apertures 302. Higher sidewalls in the high aspect ratio openings limit the amount of material that enters the opening from relatively normal oblique angles and ultimately deposits on the support surface 210. As such, enough material enters the openings 308 to form the desired feature, but not so much as to increase the height of the wider features beyond the pad height "d". This is desirable because it is possible to form different types of features on the support surface that all conform to the height necessary to reduce particulate contamination and prevent wafer bowing.

The specific shape of the sputter mask or stencil depends on the shape of the substrate support chuck 200. Typically, a substrate support chuck 200 is circular in plan form, matching the shape of a typical semiconductor wafer. The substrate support is generally supported upon apparatus 510 (of FIG. 5) for heating, cooling and retaining a substrate upon the surface 210 of the substrate support chuck 200. To retain a wafer on the surface 210, the chuck 200 may contain elements such as electrodes for electrostatically clamping the workpiece, clamps for mechanically clamping the workpiece or vacuum ports for vacuum clamping the workpiece. The invention is applicable to any chuck type. Therefore, the specific nature of the chuck and its operation is irrelevant to the invention. Additionally, the stencil 300 is shaped such that when it is placed on the surface 210 of the substrate support chuck 200, the underside surface 322 of the stencil 300 is supported by the surface 210 of the chuck 200.

The stencil 300 contains approximately 270 apertures 302 that are arrayed, for example, in a pattern of concentric rings. Each aperture 302 has the form of a countersunk hole or bore (a funnel shape) with the larger opening of the countersunk hole on the upper surface 320 of the stencil 300. Each aperture 302 also contains a counterbore 324 that is coaxially aligned with the countersunk hole and located in the underside surface 322 of the stencil 300. Illustrative examples of the dimensions of counterbore and hole are provided in the above referenced copending application. Many other sizes and arrangements of apertures are available and all such variations are considered within the scope of the present invention.

Typically, the material of the stencil is ceramic and preferably alumina. Other materials can be used such as silicon, aluminum, aluminum nitride and the like. The choice of material depends on the type of system the stencil will be used in. For example, in PVD systems, materials that minimize differential thermal expansion such as ceramics are the most desirable materials for the stencil. Another consideration in choosing stencil material is the material that will be sputtered in the system to form deposits on the surface of the substrate support. For example, it is impossible to clean and reuse a titanium stencil that has been sputtered with titanium. Therefore, if a reusable mask is desirable, the mask should be fabricated from a different material than that which is being sputtered, e.g., a silicon mask for sputtering titanium.

The calculation of the desired aspect ratios for the openings is based on a number of factors. The range of angles of material sputtered from the target must first be calculated. Since this information depends upon many factors, it is usually done by complex computer modeling. Next the growth of the sputtered material on the stencil is simulated by calculating 1000's of atoms trajectories, and observing how these atoms deposit to form a thin film over the stencil features, again performed by complex computer simulation. In general, deeper and narrower features of the stencil will allow a much slower deposition rate of sputtered on the substrate than wider or shallower stencil openings. Longer, trench like features (such as the circuit trace discussed earlier), will deposit material at the bottom of the stencil much faster than round holes of comparable aspect ratio. Using these empirical guidelines, the correct stencil can be designed using several experimental iterations of feature aspect ratio and observation of the achieved deposition rate.

Figure 5:
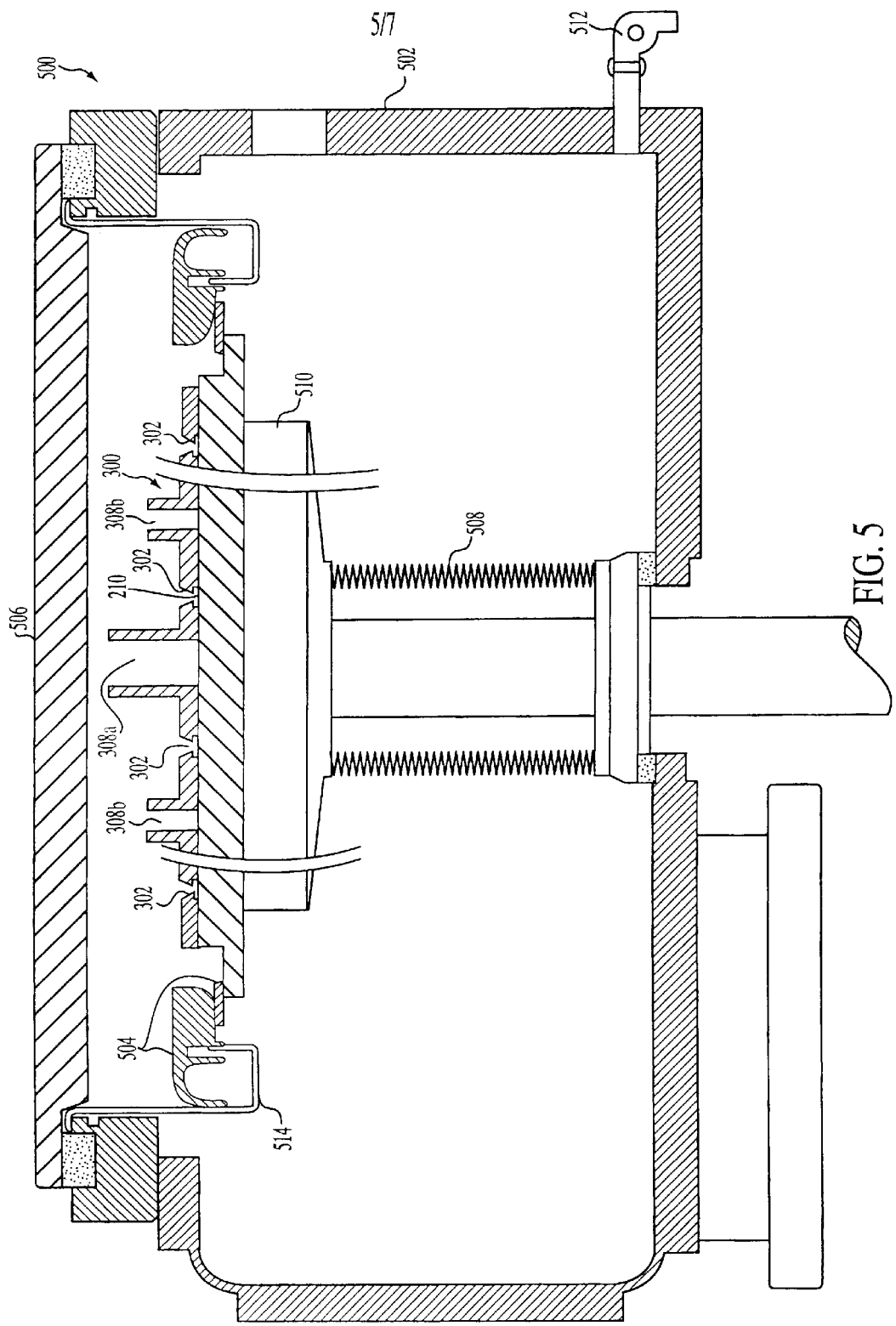
FIG. 5 depicts a cross-sectional view of a semiconductor wafer processing system incorporating the subject invention.

The method of forming deposits on the surface 210 of the substrate support chuck 200 begins with placement of the stencil 300 onto the substrate support surface 200 within a PVD system 500 as seen in FIG. 5 Note that in FIG. 5 only six features of the stencil 300 are shown in cross-section. This has been done for sake of clarity. A true cross-section of the stencil of the subject invention would depict a plurality of apertures 302, slots 306 and high aspect ratio openings 308. In addition to the chuck 200, the PVD system conventionally contains an enclosure 502 (vacuum chamber) topped by a target 506. One or more rings 504 and a shield 514 circumscribe the chuck to confine the deposition proximate the chuck. The heating/cooling apparatus 510 supporting the chuck 200 above is attached to a bellows 508 below. The bellows 508 is further attached a lower portion of the enclosure 502 to seal the enclosure 502 from atmospheric conditions. Additionally, a pressure control device 512 (e.g., a turbo pump) regulates atmospheric conditions in the enclosure 502 to establish and maintain appropriate conditions for substrate processing. The PVD system 500 is a conventional system that is operated in a conventional manner to cause sputtering of the target material upon the stencil 300 and the exposed support surface 210 of the chuck 200. The deposition material is a material that bonds to and is thermally compatible with the chuck material. For example, for ceramic chucks, deposition materials include boron-nitride, diamond, oxides, such as aluminum-oxide, and metals such as titanium. In general, this technique for patterned deposition of materials is known as lift-off deposition.

To fabricate a sufficient wafer spacing mask, the PVD system 500 deposits approximately a 15 μm layer of material while the stencil 300 is positioned on the support surface 210 of the chuck 200. Some of the deposition material passes through the apertures 302, slots 304 and high aspect ratio openings 308 of the stencil 300 and forms approximately a 2–3 μm layer of material on the surface 210 of the chuck 200 to form the desired features. Optionally, a second layer of material (not shown) may be deposited over the first layer such that an insulator may be first deposited and a conductor deposited thereover. Any number of layers comprising various materials can be deposited using the inventive stencil. Following the deposition, the target 506 is detached from the enclosure such that the stencil can be removed from the surface 210. The result is a pattern of deposition material atop the surface 210 and the sidewall 214.

Figure 6:
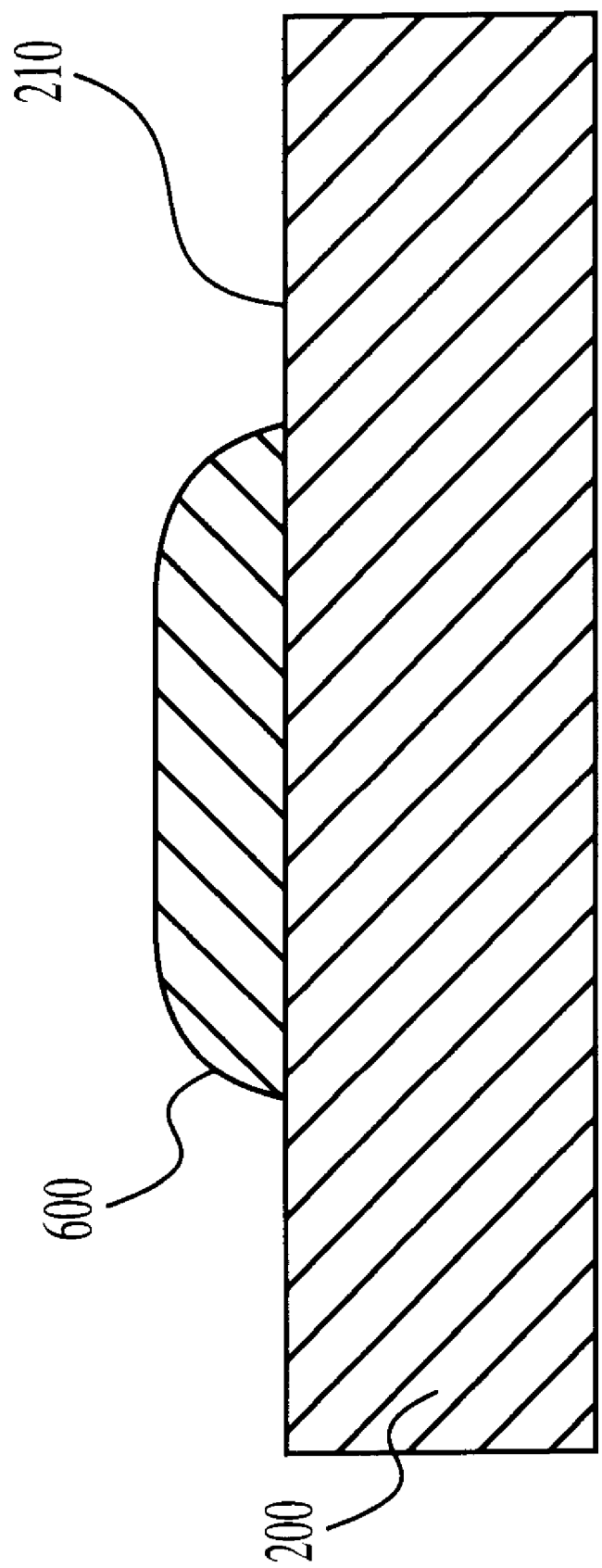
FIG. 6 depicts a cross-sectional view of a resulting surface feature upon a substrate support chuck upon which the subject invention was disposed.

The combination of the countersunk holes and the counterbores ensures a uniform deposit of material during the deposition process. Specifically, FIG. 6 depicts a vertical cross-sectional view of a resulting deposit 600 of target material on the surface 210 of the substrate support chuck 200. The counterbores prevent sticking of the stencil to the deposited material and provide material deposits having convex (domed) surfaces. Also, the countersunk apertures increase deposition rate by providing a wide aperture to permit deposition of material at a wide range of trajectory angles for the deposition material particles.

Although various embodiments which incorporate the teachings of incorporate those teachings.

What is claimed is:

1. Apparatus for forming features on a surface of a substrate support chuck, comprising:

a stencil containing a plurality of apertures, said stencil further comprising a first piece having a central opening and a plurality of apertures, and a second piece disposed in said central opening, said second piece having at least one high aspect ratio opening.

2. The apparatus of claim 1 wherein each of said plurality of apertures further comprises sidewalls and the at least one high aspect ratio opening further comprises sidewalls wherein the high aspect ratio sidewalls are taller than the aperture sidewalls.

3. The apparatus of claim 1 further comprising two high aspect ratio openings in the stencil.

4. The apparatus of claim 3 wherein a first high aspect ratio opening is an arc segment and located at a center of the stencil.

5. The apparatus of claim 4 wherein the first high aspect ratio opening is in the ratio of approximately 0.8:1.

6. The apparatus of claim 3 wherein a second high aspect ratio opening is ring-shaped and located radially outward of the first high aspect ratio opening.

7. The apparatus of claim 6 wherein the second high aspect ratio opening is in the ratio of approximately 2.4:1.

8. The apparatus of claim 1 further comprising a plurality of slots located at a periphery of said stencil.

9. The apparatus of claim 8 wherein the slots extend radially inward from the periphery of said stencil.

10. The apparatus of claim 9 wherein a number of the plurality of slots extend radially inward further than others of the plurality of slots.

11. The apparatus of claim 8 wherein the plurality of slots is 54.

12. The apparatus of claim 1 wherein the features formed by the high aspect ratio openings are wider than the features formed by the apertures.

13. The apparatus of claim 1 wherein said stencil is fabricated of a ceramic material.

14. The apparatus of claim 13 wherein said ceramic material is alumina.

15. A method of forming features on a surface of a substrate support chuck with a stencil wherein the stencil further comprises a first piece having a central opening and a second piece disposed in the central opening and having at least one high aspect ratio opening, the method comprising the steps of:

positioning the stencil on the surface of the substrate support chuck;

depositing a material onto the stencil and through a plurality of apertures provided in the stencil and said at least one high aspect ratio opening to form said features upon the surface of the substrate support chuck; and removing said stencil and leaving said features upon said surface of said substrate support chuck.

* * * * *